United States Patent
Zou et al.

(10) Patent No.: US 11,172,313 B2
(45) Date of Patent: Nov. 9, 2021

(54) MEMS MICROPHONE AND METHOD FOR SENSING TEMPERATURE

(71) Applicant: TDK Corporation, Tokyo (JP)

(72) Inventors: Lei Zou, København S (DK); Pirmin Hermann Otto Rombach, Kongens Lyngby (DK); Henning Petersen, Allerød (DK)

(73) Assignee: TDK Corporation, Tokyo (JP)

( * ) Notice: Subject to any disclaimer, the term of this patent is extended or adjusted under 35 U.S.C. 154(b) by 49 days.

(21) Appl. No.: 16/497,316

(22) PCT Filed: Mar. 20, 2018

(86) PCT No.: PCT/EP2018/057041
§ 371 (c)(1),
(2) Date: Sep. 24, 2019

(87) PCT Pub. No.: WO2018/177816
PCT Pub. Date: Oct. 4, 2018

(65) Prior Publication Data
US 2021/0127212 A1 Apr. 29, 2021

(30) Foreign Application Priority Data
Mar. 29, 2017 (DE) .......................... 102017106786.8

(51) Int. Cl.
*H04R 9/08* (2006.01)
*H04R 11/04* (2006.01)
(Continued)

(52) U.S. Cl.
CPC ............ *H04R 19/04* (2013.01); *B81B 3/0018* (2013.01); *H04R 1/028* (2013.01);
(Continued)

(58) Field of Classification Search
CPC ........ H04R 19/04; H04R 1/028; B81B 3/0018
See application file for complete search history.

(56) References Cited

U.S. PATENT DOCUMENTS 6,697,645 B1  2/2004  MacFarlane
2015/0251898 A1* 9/2015 Vos ...................... H04R 19/005
                                                        257/416
(Continued)

FOREIGN PATENT DOCUMENTS

DE  102016101863 A1  8/2016
DE  102016203228 A1  9/2016

OTHER PUBLICATIONS

Barbieri, A. et al.; "A 470 uA direct readout circuit for electret and MEMS digital microphones"; Analog Integrated Circuits and Signal Processing, vol. 81, pp. 341-344; 2013 (4 pages)
(Continued)

*Primary Examiner* — Simon King
(74) *Attorney, Agent, or Firm* — Nixon Peabody LLP

(57) ABSTRACT

A MEMS microphone integrates a temperature-sensing element in or on the ASIC die of a MEMS microphone to enable an audio mode and a temperature-sensing mode in parallel. The system also permits for a method for easily switching between these two modes and for outputting both digital output signals at the same common output pad, which allows for the use of the footprint of a conventional microphone.

14 Claims, 3 Drawing Sheets

(51) Int. Cl.
*H04R 17/02* (2006.01)
*H04R 19/04* (2006.01)
*H04R 21/02* (2006.01)
*B81B 3/00* (2006.01)
*H04R 1/02* (2006.01)

(52) U.S. Cl.
CPC .......... *B81B 2201/0257* (2013.01); *B81B 2201/0278* (2013.01); *H04R 2201/003* (2013.01)

(56) References Cited

U.S. PATENT DOCUMENTS

| | | | | |
|---|---|---|---|---|
| 2015/0350770 A1* | 12/2015 | Khenkin | ............... | H04R 19/04 381/111 |
| 2015/0350772 A1* | 12/2015 | Oliaei | ............... | H04R 1/04 381/111 |
| 2016/0165330 A1* | 6/2016 | Minervini | ............... | G01K 13/00 374/142 |
| 2016/0221822 A1 | 8/2016 | Krumbein | | |
| 2016/0277844 A1* | 9/2016 | Kopetz | ............... | H04R 19/005 |
| 2016/0377569 A1* | 12/2016 | Rajaraman | ......... | B81C 1/00182 257/416 |
| 2017/0023429 A1 | 1/2017 | Straessnigg | | |
| 2017/0026760 A1 | 1/2017 | Albers | | |
| 2017/0164118 A1* | 6/2017 | Wiesbauer | .......... | H04R 29/004 |
| 2018/0070162 A1* | 3/2018 | Lim | ........................ | H01L 23/04 |
| 2019/0194013 A1* | 6/2019 | Chandrasekaran | .... | H04R 19/04 |

OTHER PUBLICATIONS

Pathrose, J. et al.; "A time-domain smart temperature sensor without an explicit bandgap reference in SOI CMOS operating up to 225> C."; 2013 IEEE Asian Solid-State Circuits Conference (A-SSCC), pp. 173-176 (4 pages)

International Search Report corresponding to International Patent Application No. PCT/EP2018/057041, dated Jun. 26, 2018 (3 pages)

* cited by examiner

MEMS MICROPHONE AND METHOD FOR SENSING TEMPERATURE

CROSS-REFERENCE TO RELATED APPLICATIONS

This application is a U.S. National Stage of International Application No. PCT/EP2018/057041, filed Mar. 20, 2018, which claims the benefit of German Patent Application No. 10 2017 106 786.8, filed on Mar. 29, 2017, each of which is hereby incorporated herein by reference in its entirety.

In order to sense temperature with a microphone a standard stand-alone temperature sensor and the microphone can be assembled on the same module. The module then requires two analog-digital converters to digitally read out the temperature signal and the audio signal, respectively, which are both analog input signals originating from the temperature sensor and the microphone transducer. The stand-alone temperature sensor is usually an ASIC sealed inside a package and covered with a molding mass or a glob top material that both prevent ambient air to get into direct contact with the temperature sensor on the ASIC.

It has been proposed to integrate such an stand-alone temperature sensor on the base of a BJT (bipolar junction transistor within a smart phone. The sensor is build-in within the smart phone casing and has thus no direct contact with ambient air. Hence, the sensor needs time to equalize temperature and detects ambient temperature only with delay.

It is an object to provide a temperature sensor with improved sensing speed that can easily be integrated in mobile electric devices like smart phones, tablets etc.

These and other objects are met by a MEMS microphone with an integrated temperature sensing element according to claim 1.

Further embodiments of the microphone as well as an electronic device with an incorporated microphone and a method for sensing the temperature with the microphone can be taken from further claims.

Integrating a temperature-sensing element within a MEMS microphone has superior advantages. The temperature-sensing element can be embodied on or in the ASIS that is already present in the MEMS microphone besides the MEMS transducer. Moreover, the sound hole in the microphone package not only provides access of sound waves but is also a good thermic conductor and allows excellent exposure of the temperature-sensing element to the ambient air and thus, quick response to any temperature change. The reason is that the ASIC within the package does not require any sealing means like conventional stand-alone temperature sensors that could reduce the thermos-conductivity and the exposure to the air. Therefore, temperature can be measured with high accuracy. No additional space is required for the temperature-sensing element neither on the ASIC nor outside the microphone package.

The temperature-sensing element can be embodied as a resistive element or a transistor, e.g. a bipolar junction transistor BJT. Both embodiments can be realized in or on the ASIC die. They convert an analogue temperature to an electrical signal that can be read out or can be further processed.

According to an embodiment, the MEMS microphone further comprises a pre-amplifier and an analog-to-digital-converter, that are both integrated in or on the ASIC die. The analog-to-digital-converter provides at its output a second digital output signal for signals originating from the temperature-sensing element. In this connection, terms like first, second and higher numbers are identification and differentiation between different ones within a multitude of elements of the same kind. However, a second or higher number does not explicitly require the presence of a respective first one.

The analog-to-digital-converter of the MEMS microphone is adapted to convert a first analog input signal from the MEMS transducer and a second analog input signal from the temperature-sensing element to optionally provide at its output a first or a second digital output signal for signals originating from the MEMS transducer and from the temperature-sensing element respectively. Hence, the MEMS microphone provides digital output signals only that can easily be processed further. The second output signal can be coupled to an app or to a monitor to be displayed optically. The first output signal may be amplified or filtered.

The MEMS microphone can have only one analog digital converter such that both applications, i.e. the audio application and the temperature sensor application use the same analog digital converter. Therefore, switching means for switching the analog digital converter between the temperature sensor mode and the audio mode can be present and be realized within the ASIC.

Alternatively, two analog digital converter can be present, one for converting first analog input signals to first digital output signals in the audio mode, and the other one for converting second analog input signals to second digital output signals in the sensor mode. However, these two analog digital converters need more costly chip area on the ASIC and require a higher amount of power during operation.

The microphone can be adapted to produce and deliver, dependent on the state of the switching means, the first or the second digital output signal to a respective one of two separate output signal pads at the MEMS microphone. Advantageously a single output signal pad can function as a common output pad. The advantage is that in addition to the pads on the footprint of the MEMS microphone no further pad is necessary. Hence, the microphone does not need a modified package in view of a conventional MEMS microphone without sensor function. This requires very low additional costs when compared with a microphone without temperature sensor function. Compared with an additional stand-alone temperature sensor cost savings are substantial. The system is compliant with standard digital MEMS microphone pad frame or footprint.

In case of a common output pad, means for triggering the desired output signal should be present. It is possible to use the conventional clock signal to trigger the desired output signal or switch between sensor mode and audio mode.

A frequency detector is coupled to the clock frequency input and to the switching means. The frequency detector is adapted to detect a first and a second clock frequency and, as a result of the detected frequency, to control the switching means dependent on whether a first or second clock frequency is applied to the clock frequency input and detected by the frequency detector. This very flexible method reduces hardware costs compared with other switching or triggering methods.

A supply current source present in the MEMS microphone can be adapted to couple a supply current to the analog digital converter, wherein the supply current strength can be made dependent on the operation mode of the analog digital converter to take into account that the audio mode requires an amount of current higher than of the sensor mode. This helps saving energy and enhances the running time of the microphone or a mobile electronic device the microphone is incorporated in. Moreover, the low energy consumption of the temperature sensing elements TSE ensures low self-heating of the ASIC that is negligible when measuring the ambient temperature outside of the microphone.

Such a mobile electronic device may be a smart phone, a tablet computer, a headset or a smart watch.

It is advantageous to arrange the MEMS microphone with the sensor function in such a device at a low power area where no other elements, which are high current consuming, are neighbored, that produce substantial self-heating which could adversely influence the accuracy of the sensor function. So, the risk of self-heating can be minimized.

Best results are achieved when incorporating the MEMS microphone with integrated temperature sensing function in a headset. There, it is separate and distant of any highly current consuming element like a tablet computer or a smart phone.

In the following, the invention will be explained in more detail with reference to exemplary embodiments and the accompanied drawings.

The drawings are schematically only and not drawn to scale. Some elements may be depicted enlarged for better understanding.

Figure 1:
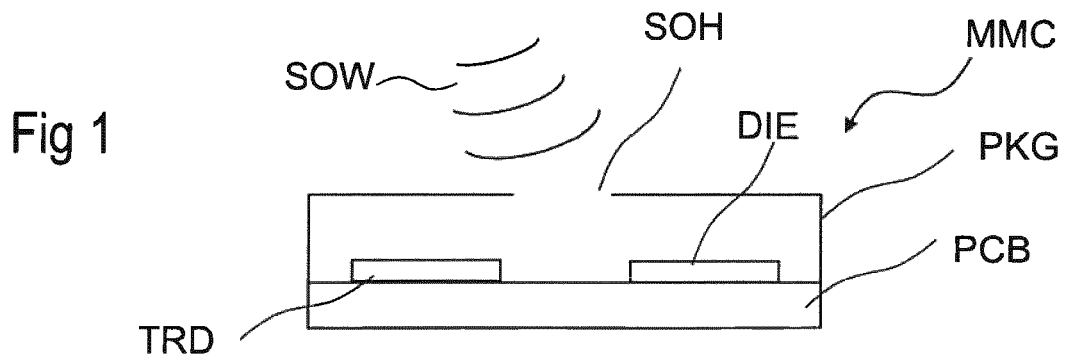
FIG. 1 shows a cross-section through a MEMS microphone arranged in a package.

FIG. 1 shows a conventional MEMS microphone MMC comprising a MEMS transducer TRD and an ASIC DIE both arranged on a common carrier PCB. Both components are arranged in the same package PKG. The package may seal against the carrier to enclose a cavity for example by mounting a cap on the carrier that encloses MEMS transducer TRD and ASIC DIE. A sound hole SOH is conducted through the package PKG, for example through the upper covering or through the carrier PCB. Outer contact pads may be arranged on the bottom of the carrier PCB.

Figure 2:
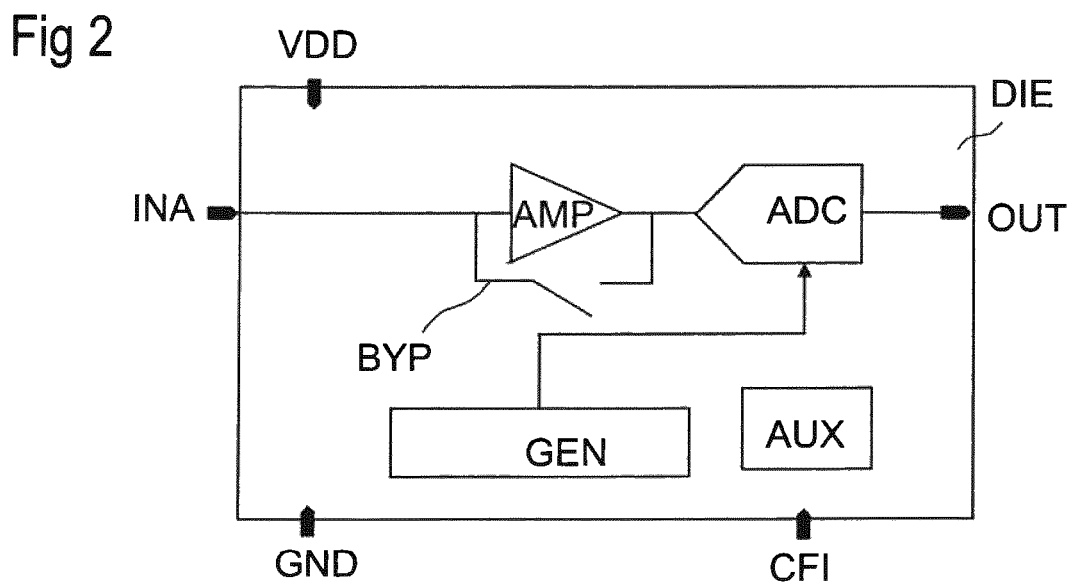
FIG. 2 shows functional blocks of an ASIC that is usable in a MEMS microphone.

FIG. 2 shows functional blocks of an ASIC DIE that is usable in a conventional MEMS microphone. The MEMS transducer produces an analog input signal INA that is coupled to an input of the ASIC. An analog pre-amplifier AMP produces an amplified analog signal that is converted to a digital output signal by an analog digital converter ADC that may be a ΣΔ (sigma delta) ADC. In case of high amplitude, input signals the pre-amplifier can be bypassed by closing respective switches to enable the bypass BYP. A current/voltage reference generator GEN supplies pre-amplifier AMP and analog digital converter ADC with a respective current or voltage. Further components of auxiliary circuits AUX are summarized in a further building block. Besides analog input, INA and digital signal output OUT at least three other pads are required for the operation of the ASIC DIE: There are pads for supply voltage VDD, ground GND and clock frequency input CFI.

ASIC and MEMS may be electrically connected by bonding wires or by conductor lines that are guided on the surface of the carrier or inside the carrier if realized as multilayer board.

Figure 3:
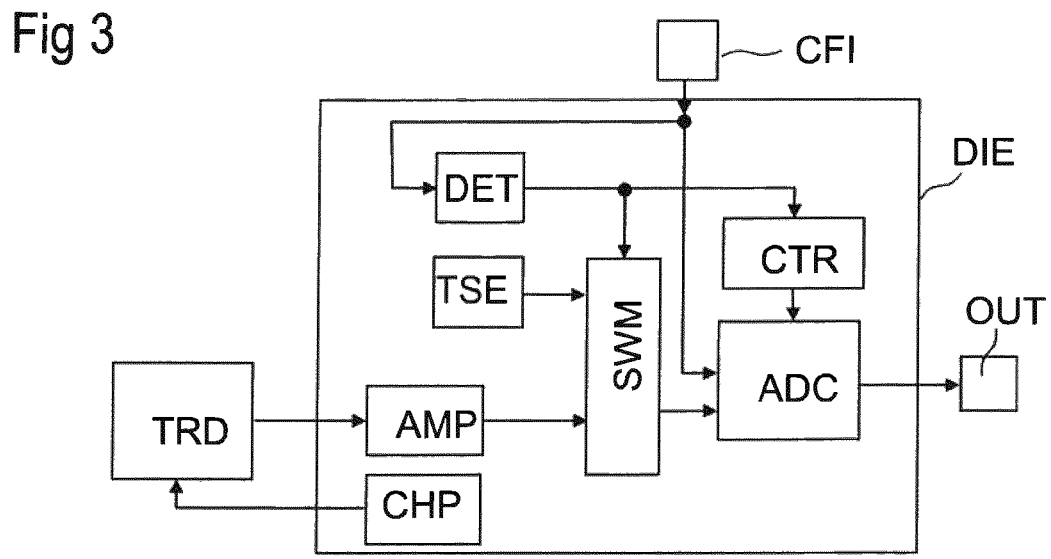
FIG. 3 shows functional blocks of an ASIC that is usable in a MEMS microphone according to the invention.

FIG. 3 shows functional blocks of an ASIC DIE that is usable in a MEMS microphone according to the invention. The other components of the MEMS microphone MMC do not require any adaption as the invention is fully incorporated in the ASIC DIE. As usual an analog input signal INA produced by the MEMS transducer TRD is coupled to an analog pre-amplifier AMP. The temperature is sensed by temperature sensing elements TSE that produce a second analog input signal that is a measure for the sensed temperature. Amplified analog audio signal and second analog input signal are both fed to a switching means SWM arranged as an interface between the analog signal sources and the analog digital converter ADC.

The switching means SWM can switch between two channels CH1 and CH2 to deliver the desired signal to the analog digital convert ADC. According to a preferred embodiment, the switching means are controlled by frequency detector DET that is configured to detect whether a first or a second clock frequency is applied to the clock frequency input CFI. A first clock frequency opens first channel CH1 for the audio signal while a second clock frequency opens second channel CH2 for the sensor signal of the temperature sensing elements TSE. The switching means SWM may be realized as an active switch. If no audio signal is operated, the MEMS microphone may operate in the temperature-sensing mode. In this mode, very low current is required to for the operation of the analog digital converter ADC. Hence, a current control CTR controls supply current of the analog digital converter ADC at a low level if the second clock frequency is detected by the frequency detector DET at the clock frequency input CFI. Adversely, the supply current of the analog digital converter ADC at a high level if the first clock frequency is detected for enabling audio mode.

In this embodiment only one analog digital converter ADC and one digital output signal pad is required that are already present in the ASIC of a conventional MEMS microphone. The above explained additional components of the invention are easily to integrate in the ASIC and do not require lot of surface of semiconductor ASIC DIE. This allows realization of the additional temperature-sensing mode at low cost. Additional current consumption for the sensor mode is very low. Moreover, it produces a minor amount of heat such that the temperature can be sensed accurately. Further, the ASIC needs no higher volume such that the same package size can be used like for a conventional MEMS microphone.

Figure 4:
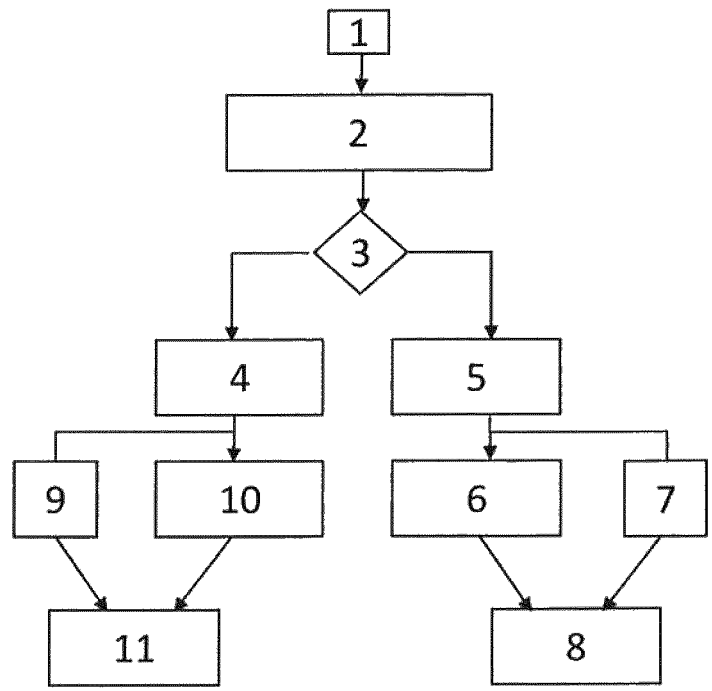
FIG. 4 shows the process flow of a method for sensing a temperature with an MEMS microphone according to the invention.

FIG. 4 shows the process flow for a new method for sensing a temperature with an MEMS microphone according to the invention.

In the first step 1, a clock frequency is applied to the clock frequency input and coupled to a frequency detector. A first clock frequency may be selected for example at about 1 GHz. A second clock frequency may be selected for example at about 10 kHz. In the example, any other frequency may be selected as a first frequency f1 if f1>768 kHz and any other frequency may be selected as a second frequency f2 if f2<20 kHz.

In step 2, the frequency detector is configured to detect whether a first or a second frequency is applied.

In step 3, a switching means opens first channel CH1 if f1>768 kHz to proceed with step 4, or switches to second channel CH2 if f2<20 kHz and to proceed with step 5.

Alternatively, it is possible to configure the frequency detector at step 2 to deliver a parameter "1" at step 4 or a "0" at step 5 dependent on the detected clock frequency. At step 10, the first channel CH1 is enabled if the parameter equals 1. The parameter "1" issued at 4 further enables a current source control at step 9 to provide a large current to the analog digital converter ADC.

In the other case at step 6, the second channel CH2 is enabled if the parameter equals 0. If parameter "0" is issued at 5 a current source control at step 7 is enabled to provide only a small current to the analog digital converter ADC.

The analog digital converter ADC operates in a microphone or audio mode at step 11 thereby consuming a large current if first channel CH1 is enabled. If second channel CH2 is enabled the analog digital converter ADC, operates in the sensor mode at step 8 if the second channel CH2 is enabled.

In the above method of switching a MEMS microphone between an audio mode and a temperature sensor mode according to the invention the clock frequency is selected dependent of the bandwidth of the incoming analog signal. In the audio mode, the maximal expected signal bandwidth of first channel CH1 is 20 kHz. Hence, first channel CH1 is a fast speed channel and a higher clock frequency is set to f1>768 kHz. A parameter output 1 enables current control to provide a high current (e.g. >100 µA) to the analog digital converter ADG thereby enabling high speed converting at the analog digital converter ADG.

In the sensor mode, the maximal expected signal bandwidth of second channel CH2 is 100 Hz. Hence, second channel CH2 is a low speed channel and a slow clock frequency is set that f2<20 kHz. A parameter output 0 enables current control to provide a low supply current (e.g. <50 µA) to the analog digital converter ADG to support a low speed converting at the analog digital converter ADG.

Figure 5:
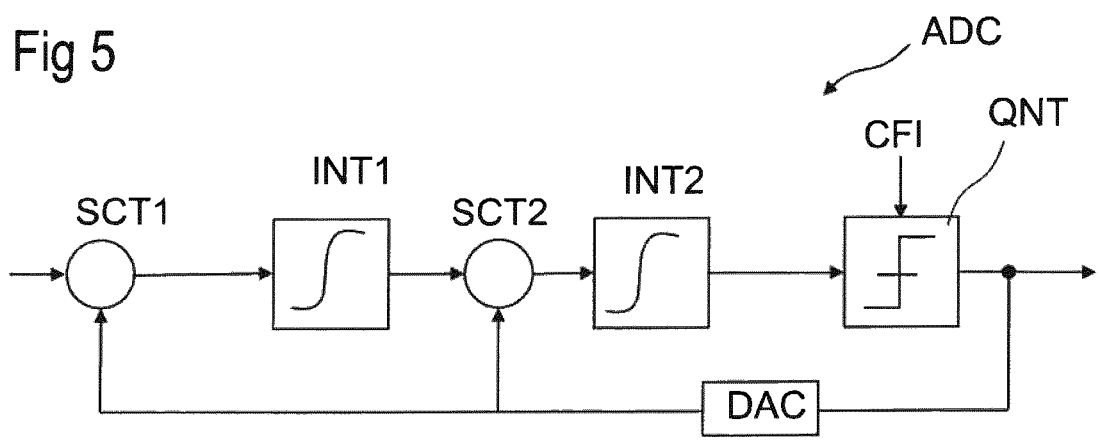
FIG. 5 shows the functional blocks of a sigma/delta analog digital converter that can be used with an MEMS microphone according to the invention.

FIG. 5 shows a possible configuration of an analog digital converter ADG that is a second-order sigma delta ADG that may be used together with the invention. Such a sigma delta analog digital converter ADG comprises a first subtract SCT1, a first integrator INT1, a second subtract SCT2, a second integrator INT2, and a quantizer QNT that is sampled with a clock at clock frequency input CFI, and a digital-to-analog converter DAC. The input of the first subtract SCT1 is connected with the analog input of the analog digital converter ADG and the output of the digital-to-analog converter DAC. The difference of the two inputs is provided to the first integrator INT1. The input of the second subtract SCT2 is connected with the output of the first subtract SCT1 the output of the digital-to-analog converter DAC. The difference of the two inputs is provided to the second integrator INT2. The output of the second integrator INT2 is quantized by the quantizer QNT, which is clock sampled. The quantized output is coupled to the digital-to-analog converter DAC to generate loop feedback signals.

In such a second order analog digital converter the two integrators INT1, INT2 are consuming most of the supplied current. In general, they are realized as an operational amplifier. The current control block at steps 7 and 9 in FIG. 4 adjusts the current supplied to the amplifiers. If supply current is set high a high bandwidth can be reached resulting in a high-speed analog to digital converting operation. If the supply current is set low, a low bandwidth and a low speed analog to digital converting operation results. The current control is set based on the clock frequency applied to the quantizer QNT and the frequency detector DET.

Figure 6:
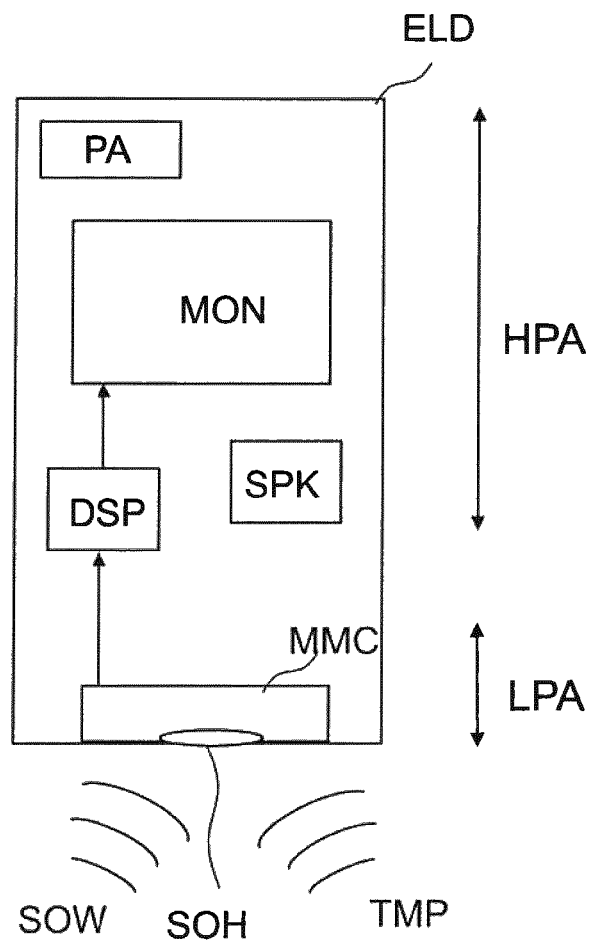
FIG. 6 shows an electronic device equipped with an MEMS microphone according to the invention.

FIG. 6 shows the implementation of the MEMS microphone MMC in an electronic device ELD, i.e. a smart phone in the depicted example. The electronic device ELD comprises a transmitter, a power amplifier PA and an antenna that represent high-energy consuming parts that are expected to produce substantial amount of self-heating. It is advantageous to place these high power-consuming components in a high power area HPA of the electronic device ELD to reserve a low power area LPA where no such high power consuming components are present. According to the size of conventional electronic devices alike smart phones reaching 12 to about 20 cm, the microphone can be placed far away from the high power area in the low power area LPA where no self-heating is expected and an accurate operation of the temperature sensing elements TSE is possible. Further power consuming components like a digital signal processor DSP, a monitor MON and a speaker SPK could be arranged in the high power area HPA.

The MEMS microphone MMC is arranged inside the casing of the electronic device ELD. A recess is feed through the casing matching with the sound hole of the microphone MMC. Hence, sound waves SOW as well as outside ambient atmosphere of a current temperature TMP can intrude into the microphone package through recess and sound hole SOH to impact on MEMS transducer TRD and temperature sensing elements TSE on the ASIC DIE as well.

As an alternative, the MEMS microphone with temperature sensing elements can be placed in a headset that is connectable with the electronic device by plug. Dependent on whether first or second channel is enabled in the microphone analog sensor signals or analog audio signals are delivered by the headset to the digital signal processor DSP. The integrated microphone of the electronic device (smart phone or table for example) can then be by-passed. Because of the greater distance of the headset with the microphone from the high power consuming components in the device, no or lower self-heating is expected allowing a more accurate temperature sensing.

The invention has been explained on a small number of embodiments but is not restricted to the embodiments and the exemplary figures. Further combinations of features that are shown in different embodiments can represent not-shown embodiments lying within the scope of the invention.

LIST OF ELEMENTS AND REFERENCE SYMBOLS

| | |
|---|---|
| 1-11 | process steps |
| ADC | analog-to-digital-converter |
| AUX | auxiliary circuit |
| BYP | Bypass |
| CFI | clock frequency input |
| CHP | charge pump |
| CTR | current control |
| DAC | digital-to-analog converter |
| DET | frequency detector |
| DIE | ASIC die |
| DSP | digital signal processing |
| ELD | electronic device |
| f1, f2 | first and a second clock frequency |
| GEN | current voltage reference generator |
| HPA | high power area of ELD |
| INT1, 2 | first and second integrator |
| LPA | low power area of ELD |
| MCM | MEMS microphone |
| MIF | microphone interface |
| MON | monitor |
| OUT | output of ADC |
| PA | power amplifier |
| PAAMP | pre-amplifier |
| PCB | carrier board |
| PKG | package |
| QNT | quantizer |
| SOH | sound hole |

-continued

| | |
|---|---|
| SOW | sound wave |
| SPK | speaker |
| STR1, 2 | first and second subtract |
| SWM | switching means |
| TMP | ambient atmosphere having a temperature |
| TRD | MEMS transducer |
| TSE | temperature sensing element |

The invention claimed is:

1. A MEMS microphone, comprising
a MEMS transducer;
an ASIC die;
a package in which the MEMS transducer and the ASIC die are arranged, the package having a sound hole; and
a temperature-sensing element integrated in or on the ASIC die; and
an analog-to-digital-converter within the package, the analog-to-digital-converter providing a first digital output signal associated with the MEMS transducer, the analog-to-digital-converter providing a second digital output signal associated with the temperature-sensing element; and
a switch for switching the analog-to-digital-converter between a temperature sensing mode and a microphone mode, and
wherein the MEMS microphone is adapted to produce and deliver, dependent on the mode of the switch, the first digital output signal or the second digital output signal to a respective one of two separate output signal pads or to a common output signal pad.

2. The MEMS microphone of claim 1, further comprising a pre-amplifier integrated in or on the ASIC die.

3. The MEMS microphone of claim 2, wherein the analog-to-digital-converter is adapted to convert a first analog input signal from the MEMS transducer and a second analog input signal from the temperature-sensing element to optionally provide, at the output, the first digital output signal or the second digital output signal for signals originating from the MEMS transducer and from the temperature-sensing element, respectively.

4. The MEMS microphone of claim 2, further comprising a supply current source adapted to couple a supply current to the analog-to-digital-converter, wherein the supply current strength is dependent on the operation mode of the analog-to-digital-converter to take into account a higher amount of current required for the microphone mode.

5. The MEMS microphone of claim 1, wherein the temperature-sensing element is embodied as a resistive element or a transistor.

6. The MEMS microphone of claim 1, wherein the sound hole is adapted to allow exposure of the temperature-sensing element to the ambient temperature.

7. The MEMS microphone of claim 1, further comprising a clock frequency input and a frequency detector that is coupled to the clock frequency input and to the switch, wherein the frequency detector is adapted to detect a first and a second clock frequency and to control the switch dependent on the detection of the first clock frequency or the second clock frequency.

8. The MEMS microphone of claim 1, in combination with an electronic device, the MEMS microphone being a part of the electronic device.

9. The combination of claim 8, wherein the electronic device is selected from the group consisting of a mobile communication unit, a smart phone, a tablet computer, a smart watch, and a headset.

10. The combination of claim 9, wherein the first digital output signal and the second digital output signal originating from the MEMS transducer and from the temperature-sensing element, respectively, share a single output pad.

11. A method of sensing a temperature with a MEMS microphone, the MEMS microphone comprising a MEMS transducer, an ASIC die, and a temperature-sensing element integrated in or on the ASIC die, the MEMS transducer and the temperature-sensing element being arranged in a package that has a sound hole, the method comprising:
coupling a first clock frequency f1 or a second clock frequency f2 to a clock input of the MEMS microphone, the first frequency f1 is assigned to a microphone operation mode, the second frequency f2 is assigned to a temperature-sensing mode, and wherein the first frequency f1 is greater than the second frequency f2;
detecting the frequency of the clock with a frequency detector;
producing a first digital output signal relating to a first analog input signal provided by the MEMS transducer if the clock frequency is the first frequency f1; and
producing a second digital output signal relating to a second analog input signal provided by the temperature-sensing element if the clock frequency is the second frequency f2.

12. The method of claim 11, wherein the first analog signal input is an amplified signal originating from microphone transducer, wherein the second analog signal input is originating from temperature sensing element, wherein dependent on the clock frequency, the two analog input signals are converted to a first digital output signal or a second digital output signal, respectively, by an analog-digital converter.

13. The method of claim 11, wherein the frequency detector detects whether the clock frequency is
(a) above a first threshold, or
(b) below a second threshold,
and in case of (a), assigns the clock frequency to the first frequency f1 and couples the amplified signal to the analog-digital converter,
and in case of (b), assigns the clock frequency to the second frequency f2 and couples the second analog input signal or the amplified signal to the analog-digital converter.

14. A MEMS microphone comprising
a MEMS transducer;
an ASIC die;
a package in which the MEMS transducer is arranged, the package having
a sound hole;
a temperature-sensing element integrated in or on the ASIC;
a pre-amplifier and an analog-to-digital-converter, the pre-amplifier and the analog-to-digital-converter being integrated in or on the ASIC die;
a switch that switches the analog-to-digital-converter between a temperature sensing mode and a microphone mode, and to deliver, dependent on the state of the switch, a first or a second digital output signal to a respective one of two separate output signal pads at the MEMS microphone or to a common output signal pad; and a clock frequency input and a frequency detector, the frequency detector being is coupled to the clock frequency input and to the switch, and wherein the frequency detector is adapted to detect a first and a second clock frequency and to control the switch dependent on the detection of first or second clock frequency.

* * * * *